US012107586B2

(12) United States Patent
Chen et al.

(10) Patent No.: US 12,107,586 B2
(45) Date of Patent: Oct. 1, 2024

(54) BD PWM MODULATION CIRCUIT FOR USE IN CLASS D AMPLIFIER AND MODULATION METHOD THEREOF

(71) Applicant: RICHTEK TECHNOLOGY CORPORATION, Zhubei (TW)

(72) Inventors: Yi-Kuang Chen, Taichung (TW); Ming-Jun Hsiao, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 476 days.

(21) Appl. No.: 17/681,728

(22) Filed: Feb. 26, 2022

(65) Prior Publication Data

US 2022/0302912 A1    Sep. 22, 2022

(30) Foreign Application Priority Data

Mar. 18, 2021   (TW) .................................. 110109853

(51) Int. Cl.
*H03F 3/217*   (2006.01)
*H03K 7/08*    (2006.01)
*H03K 3/017*   (2006.01)

(52) U.S. Cl.
CPC ............... *H03K 7/08* (2013.01); *H03F 3/217* (2013.01); *H03F 2200/351* (2013.01); *H03K 3/017* (2013.01)

(58) Field of Classification Search
CPC ..... H03K 7/08; H03F 3/217; H03F 2200/351; H03F 3/183; H03F 3/2173; H03F 3/38; H03F 3/2171
See application file for complete search history.

(56) References Cited

U.S. PATENT DOCUMENTS

| 6,828,836 | B1 * | 12/2004 | Barrow ................. | H02M 3/156 327/172 |
| 7,692,464 | B2 * | 4/2010 | Murakami ............... | H03K 7/08 327/175 |
| 9,660,588 | B1 * | 5/2017 | Wu ........................ | H03F 1/0205 |
| 10,090,663 | B2 * | 10/2018 | Chen ...................... | H03K 3/017 |

* cited by examiner

*Primary Examiner* — Khanh V Nguyen
(74) *Attorney, Agent, or Firm* — Tung & Associates

(57) ABSTRACT

A BD type pulse width modulation (PWM) circuit is configured to convert a pair of complementary input signals to a pair of output PWM signals. The BD PWM circuit modulates a basic modulation signal according to the pair of input signals, to generate a basic PWM signal. The common mode levels of the pair of input signals and the basic modulation signal are the same. The BD PWM circuit modulates an offset modulation signal according to the pair of input signals to generate an offset PWM signal. The offset modulation signal and the basic modulation signal have a non-zero offset in between. The BD PWM circuit selects the offset PWM signal or a heavy load PWM signal as the pair of output PWM signals. The heavy load PWM signal is correlated with the basic PWM signal.

20 Claims, 8 Drawing Sheets

BD PWM MODULATION CIRCUIT FOR USE IN CLASS D AMPLIFIER AND MODULATION METHOD THEREOF

CROSS REFERENCE

The present invention claims priority to TW 110109853 filed on Mar. 18, 2021.

BACKGROUND OF THE INVENTION

Field of Invention

The present invention relates to a BD type pulse width modulation (BD PWM) circuit for use in a class D amplifier; particularly, it relates to such BD PWM circuit having a common mode hopping function, to reduce power consumption. The present invention also relates to a BD PWM method for use in a class D amplifier.

Description of Related Art

Please refer to FIG. 1, which illustrates a signal waveform diagram depicting the operation of a conventional class D amplifier adopting a BD type modulation. In this prior art, a pair of complementary input signals Vep and Ven modulate a basic modulation signal (i.e., triangular wave VTRI), to generate basic pulse width modulation (PWM) signals PS1$p$ and PS1$n$ for driving a load. The signal PS1$d$ is a differential mode signal of the basic PWM signals PS1$p$ and PS1$n$, whereas, the signal PS1$c$ is a common mode signal of the basic PWM signals PS1$p$ and PS1$n$. BD type modulation has an advantage that it can reduce the demand for an output filter. However, the prior art shown in FIG. 1 has a drawback that: in light load condition, the duty ratio of the common mode signal PS1$c$ will reach as high as 50%, so that the ripple current and the idle current will become their maximum. As a result, there will be undesirable power consumption, thus reducing conversion efficiency.

Please refer to FIG. 2, which illustrates a signal waveform diagram depicting the operation of another conventional class D amplifier adopting a BD type modulation. This prior art adopts asymmetrical driving approach. That is, because the adjusted output PWM signal PSOp and the adjusted output PWM signal PSOn are asymmetrical to each other, the ripple current of the common mode signal PSOc can be reduced. However, the prior art shown in FIG. 2 has a drawback that it often causes distortion of the duty ratio of the differential mode signal PSOd, resulting in distortion of the output signal.

Please refer to FIG. 3, which illustrates a signal waveform diagram depicting the operation of still another conventional class D amplifier adopting a BD type modulation. This prior art executes a non-linear level adjustment on a pair of input signals Vep and Ven according to levels of the pair of input signals Vep and Ven, so as to decrease the duty ratio of the common mode signal PSOc in light load condition. However, the non-linear level adjustment often causes distortion of the differential mode signal PSOd.

In view of the above, to overcome the drawbacks in the prior art, the present invention proposes a BD type PWM circuit for use in a class D amplifier, whose common mode voltage can adaptively hop. The present invention can effectively reduce the ripple current and the idle current, and can ensure a low distortion of the output signal.

SUMMARY OF THE INVENTION

From one perspective, the present invention provides a BD type pulse width modulation (PWM) circuit for use in a class D amplifier, which is configured to operably convert a pair of complementary input signals to a pair of output PWM signals; the BD PWM circuit comprising: a duty ratio adjustment circuit, which is configured to operably generate a plurality of intermediate PWM signals, wherein the plurality of intermediate PWM signals include: a basic PWM signal, an offset PWM signal and a heavy load PWM signal, wherein each intermediate PWM signal correspondingly has an in-phase sub-signal, a reversed-phase sub-signal and a differential mode signal, wherein the differential mode signal is a difference between the in-phase sub-signal and the reversed-phase sub-signal, wherein the duty ratio adjustment circuit includes: a basic comparison circuit, which is configured to operably modulate a basic modulation signal according to the pair of input signals, to generate the basic PWM signal, wherein a common mode level of the pair of input signals is the same as a common mode level of basic modulation signal; and an offset comparison circuit, which is configured to operably modulate an offset modulation signal according to the pair of input signals, to generate the offset PWM signal, wherein the offset modulation signal and the basic modulation signal have a non-zero offset in between; a load detection circuit, which is configured to operably determine whether levels of the pair of input signals are lower than a light load threshold according to the offset PWM signal, wherein when the levels of the pair of input signals are lower than the light load threshold, a light load signal is enabled; and an output selection circuit, which is configured to operably select the offset PWM signal as the pair of output PWM signals in a case when the levels of the pair of input signals are lower than the light load threshold and select the heavy load PWM signal as the pair of output PWM signals in a case when the levels of the pair of input signals are not lower than the light load threshold, so that a root-mean-square power of the pair of output PWM signals is smaller than a root-mean-square power of the basic PWM signal; wherein the heavy load PWM signal is correlated with the basic PWM signal.

In one embodiment, the load detection circuit is configured to periodically determine, according to an operation period, whether the in-phase sub-signal and the reversed-phase sub-signal corresponding to the offset PWM signal both have a pulse within a previous operation period, so as to enable the light load signal accordingly, wherein the enablement of the light load signal is indicative of a case where the levels of the pair of input signals are lower than the light load threshold.

In one embodiment, the heavy load PWM signal corresponds to or is the basic PWM signal; or the plurality of intermediate PWM signals further includes a one-side PWM signal, and the heavy load PWM signal corresponds to or is the one-side PWM signal; wherein the duty ratio adjustment circuit further includes: a one-side selection circuit, which is configured to operably generate the in-phase sub-signal corresponding to the one-side PWM signal according to a positive value of the differential mode signal corresponding to the basic PWM signal, and to operably generate the reversed-phase sub-signal corresponding to the one-side PWM signal according to a negative value of the differential mode signal corresponding to the basic PWM signal.

In one embodiment, the heavy load PWM signal is the one-side PWM signal or the basic PWM signal.

In one embodiment, the pair of output PWM signals are configured to operably control a driver stage circuit, so as to drive two ends of a load in a pulse width modulation fashion, wherein the heavy load PWM signal is determined to be the one-side PWM signal or the basic PWM signal according to a power supply of the driver stage circuit, a level of the load, a temperature related to the class D amplifier, or an operation frequency, wherein the operation frequency corresponds to the operation period.

In one embodiment, a level of the offset is correlated with the light load threshold.

In one embodiment, each of the basic modulation signal and the offset modulation signal is configured as a triangular wave or a sawtooth wave, wherein the basic modulation signal and the offset modulation signal are both synchronous with the operation period.

In one embodiment, an absolute value of a level of the offset is smaller than ½ of a peak-to-peak value of the basic modulation signal.

In one embodiment, the basic comparison circuit includes: a first comparator, which is configured to operably compare an in-phase input signal of the pair of input signals with the basic modulation signal, so as to generate the in-phase sub-signal of the basic PWM signal; and a second comparator, which is configured to operably compare a reversed-phase input signal of the pair of input signals with the basic modulation signal, so as to generate the reversed-phase sub-signal of the basic PWM signal; the offset comparison circuit includes: a third comparator, which is configured to operably compare the in-phase input signal of the pair of input signals with the offset modulation signal, so as to generate the in-phase sub-signal of the offset PWM signal; and a fourth comparator, which is configured to operably compare the reversed-phase input signal of the pair of input signals with the offset modulation signal, so as to generate the reversed-phase sub-signal of the offset PWM signal.

In one embodiment, the load detection circuit includes: a first status circuit, which is configured to operably trigger an in-phase pulse indication signal according to the in-phase sub-signal of the offset PWM signal; a second status circuit, which is configured to operably trigger a reversed-phase pulse indication signal according to the reversed-phase sub-signal of the offset PWM signal; and a third status circuit, which is configured to operably determine whether the in-phase pulse indication signal and the reversed-phase pulse indication signal are both enabled according to a clock signal cycling by the operation period, so as to trigger and enable the light load signal, thereby indicating that the levels of the pair of input signals are lower than the light load threshold.

In one embodiment, the one-side selection circuit includes: a first logic gate, which is configured to operably execute an AND logic operation on a reversed-phase signal of the reversed-phase sub-signal of the basic PWM signal and the in-phase sub-signal of the basic PWM signal, so as to generate the in-phase sub-signal of the one-side PWM signal; and a second logic gate, which is configured to operably execute an AND logic operation on a reversed-phase signal of the in-phase sub-signal of the basic PWM signal and the reversed-phase sub-signal of the basic PWM signal, so as to generate the reversed-phase sub-signal of the one-side PWM signal.

From another perspective, the present invention provides a BD type pulse width modulation (PWM) method for use in a class D amplifier, which is configured to operably convert a pair of complementary input signals to a pair of output PWM signals; the BD PWM method comprising: step S1: generating a plurality of intermediate PWM signals, wherein the plurality of intermediate PWM signals includes: a basic PWM signal, an offset PWM signal and a heavy load PWM signal, wherein each intermediate PWM signal correspondingly has an in-phase sub-signal, a reversed-phase sub-signal and a differential mode signal, wherein the differential mode signal is a difference between the in-phase sub-signal and the reversed-phase sub-signal, wherein the step for generating the plurality of intermediate PWM signals includes: step S11: modulating a basic modulation signal according to the pair of input signals, to generate the basic PWM signal, wherein a common mode level of the pair of input signals is the same as a common mode level of basic modulation signal; and step S12: modulating an offset modulation signal according to the pair of input signals, to generate the offset PWM signal, wherein the offset modulation signal and the basic modulation signal have a non-zero offset in between; step S2: determining whether levels of the pair of input signals are lower than a light load threshold according to the offset PWM signal; and step S3: selecting the offset PWM signal as the pair of output PWM signals in a case when the levels of the pair of input signals are lower than the light load threshold and selecting the heavy load PWM signal as the pair of output PWM signals in a case when the levels of the pair of input signals are not lower than the light load threshold, so that a root-mean-square power of the pair of output PWM signals is smaller than a root-mean-square power of the basic PWM signal; wherein the heavy load PWM signal is correlated with the basic PWM signal.

In one embodiment, the step for determining whether levels of the pair of input signals are lower than the light load threshold according to the offset PWM signal includes: periodically determining, according to an operation period, whether the in-phase sub-signal and the reversed-phase sub-signal corresponding to the offset PWM signal both have a pulse within a previous operation period, so as to determine whether levels of the pair of input signals are lower than the light load threshold.

In one embodiment, the heavy load PWM signal corresponds to or is the basic PWM signal; or the plurality of intermediate PWM signals further includes a one-side PWM signal, and the heavy load PWM signal corresponds to or is the one-side PWM signal; wherein the step for generating the plurality of intermediate PWM signals further includes: generating the in-phase sub-signal corresponding to the one-side PWM signal according to a positive value of the differential mode signal corresponding to the basic PWM signal, and generating the reversed-phase sub-signal corresponding to the one-side PWM signal according to a negative value of the differential mode signal corresponding to the basic PWM signal.

In one embodiment, the pair of output PWM signals are configured to operably control a driver stage circuit, so as to drive two ends of a load in a pulse width modulation fashion, wherein the heavy load PWM signal is determined to be the one-side PWM signal or the basic PWM signal according to a power supply of the driver stage circuit, a level of the load, a temperature related to the class D amplifier, or an operation frequency, wherein the operation frequency corresponds to the operation period.

In one embodiment, the step for generating the basic PWM signal includes: comparing an in-phase input signal of the pair of input signals with the basic modulation signal, so as to generate the in-phase sub-signal of the basic PWM signal; and comparing a reversed-phase input signal of the pair of input signals with the basic modulation signal, so as to generate the reversed-phase sub-signal of the basic PWM signal; the step for generating the offset PWM signal includes: comparing the in-phase input signal of the pair of input signals with the offset modulation signal, so as to generate the in-phase sub-signal of the offset PWM signal;

and comparing the reversed-phase input signal of the pair of input signals with the offset modulation signal, so as to generate the reversed-phase sub-signal of the offset PWM signal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
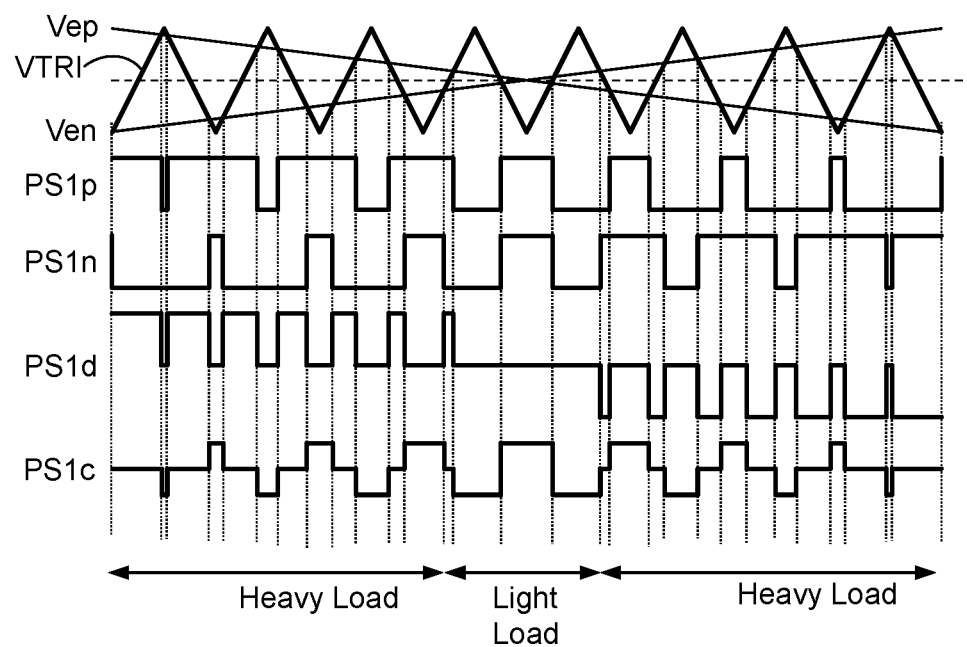
FIG. 1 illustrates a signal waveform diagram depicting the operation of a conventional class D amplifier adopting a BD type modulation.
Figure 2:
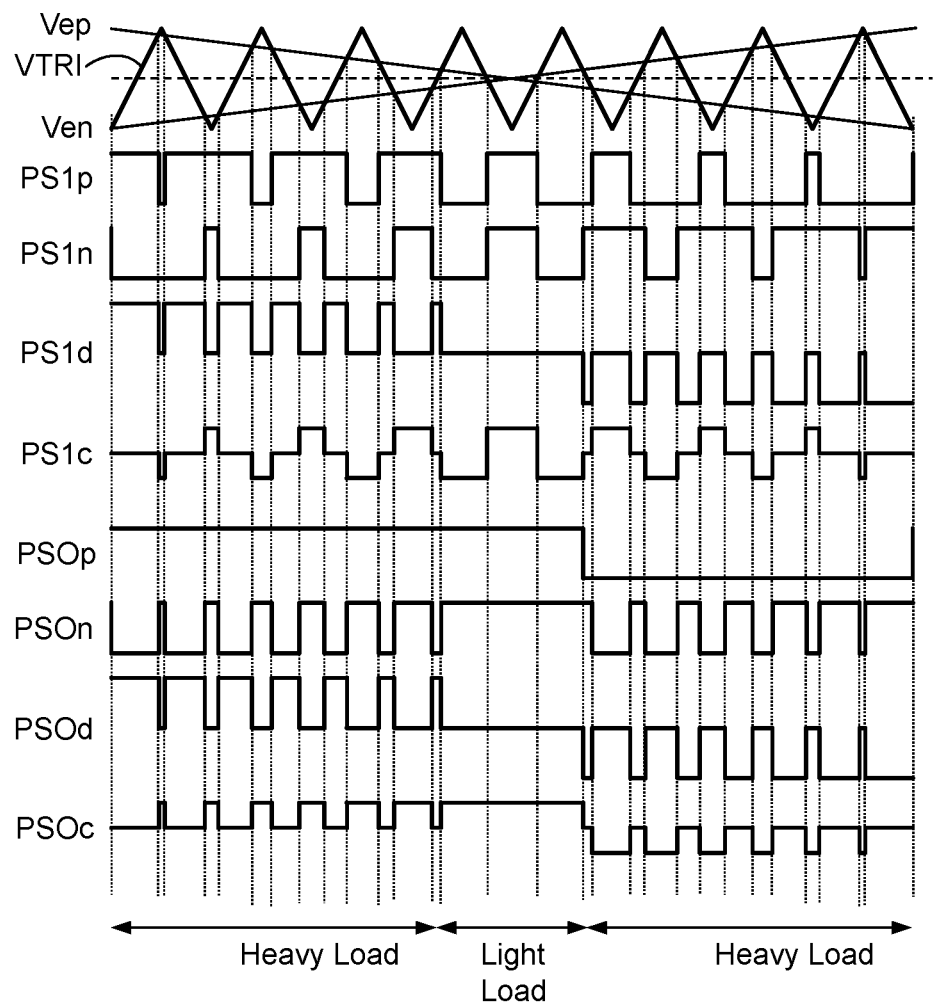
FIG. 2 illustrates a signal waveform diagram depicting the operation of another conventional class D amplifier adopting a BD type modulation.
Figure 3:
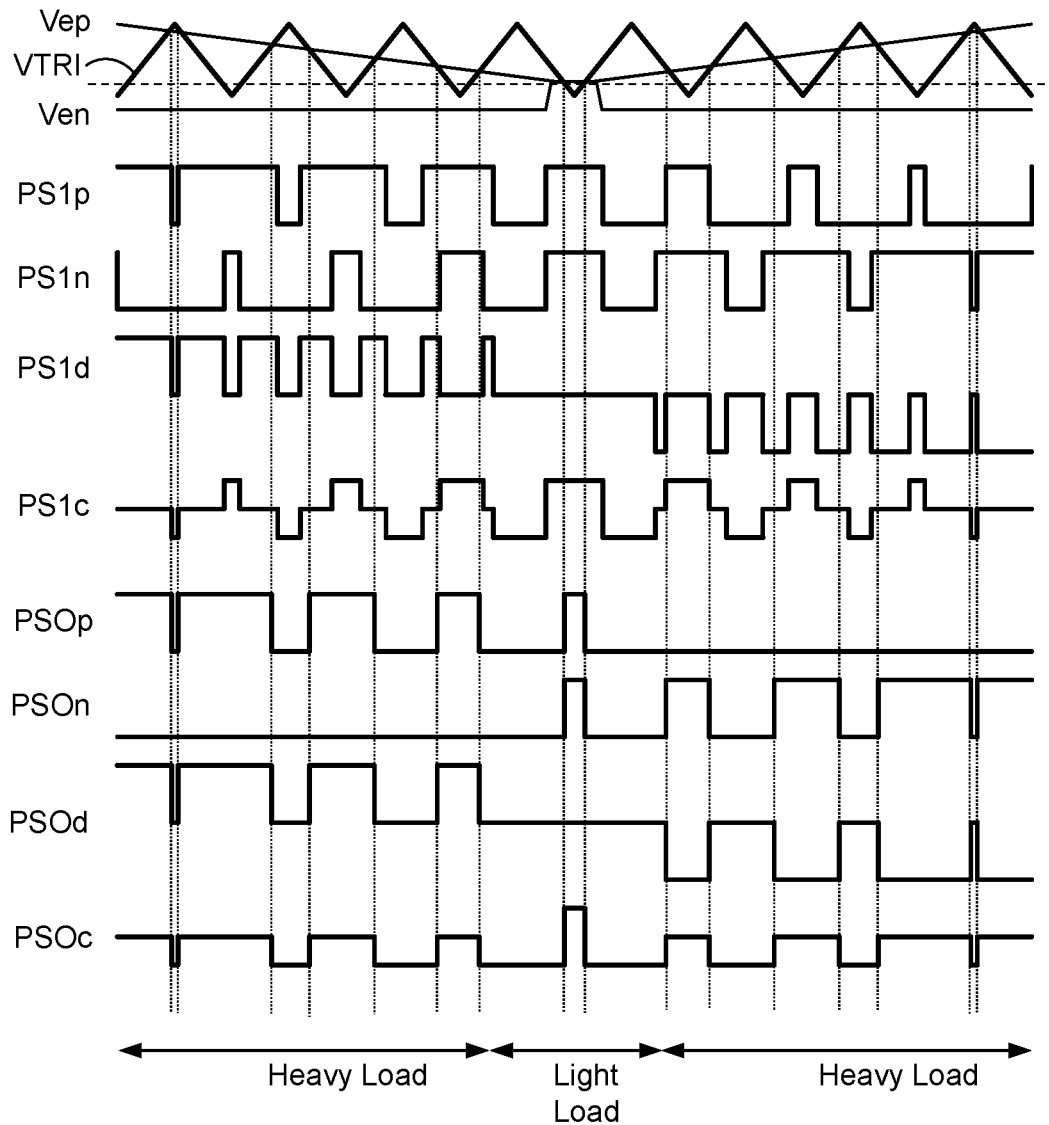
FIG. 3 illustrates a signal waveform diagram depicting the operation of still another conventional class D amplifier adopting a BD type modulation.
Figure 4:
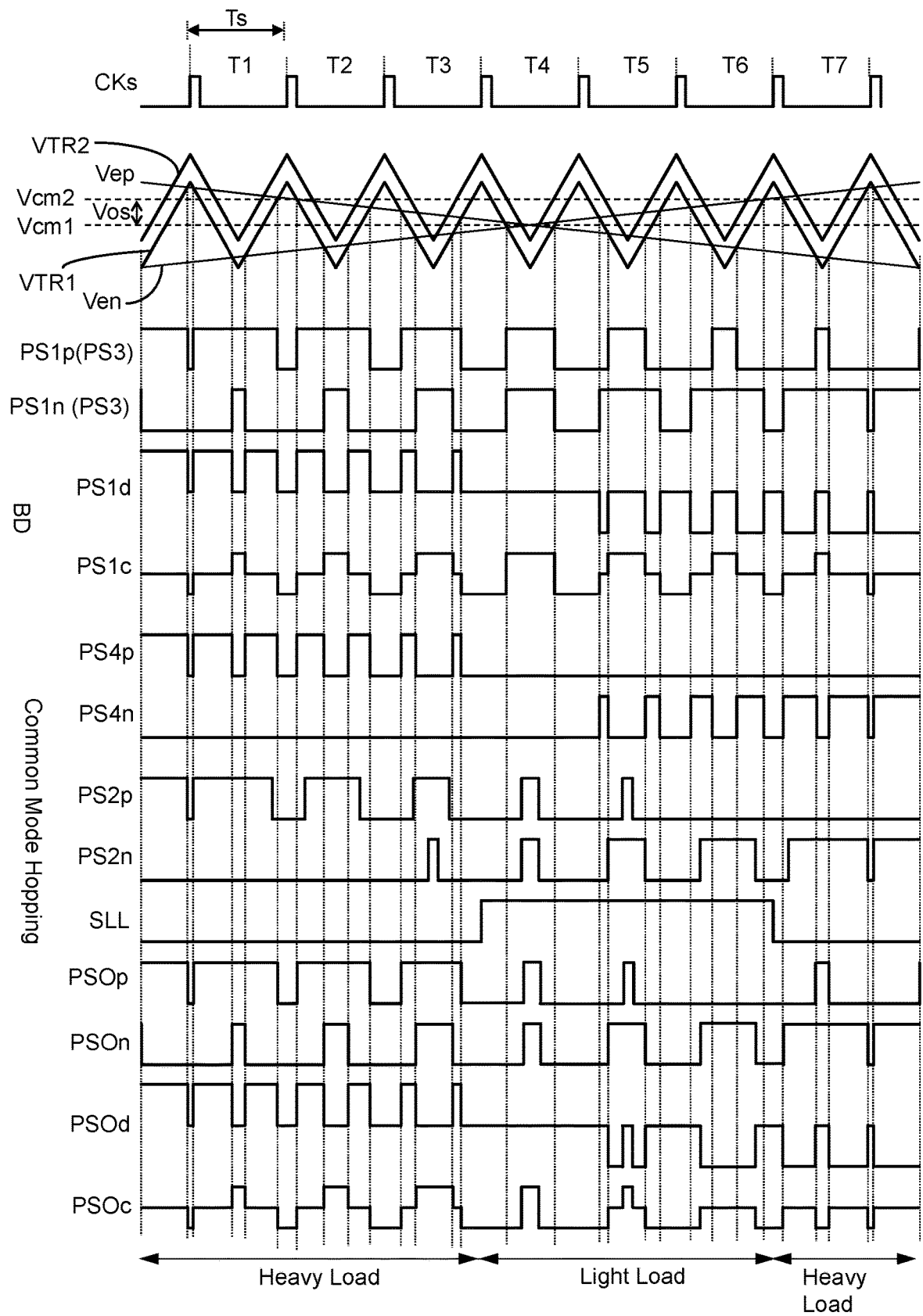
FIG. 4 illustrates a signal waveform diagram depicting the operation of a class D amplifier according to an embodiment of the present invention.
Figure 5:
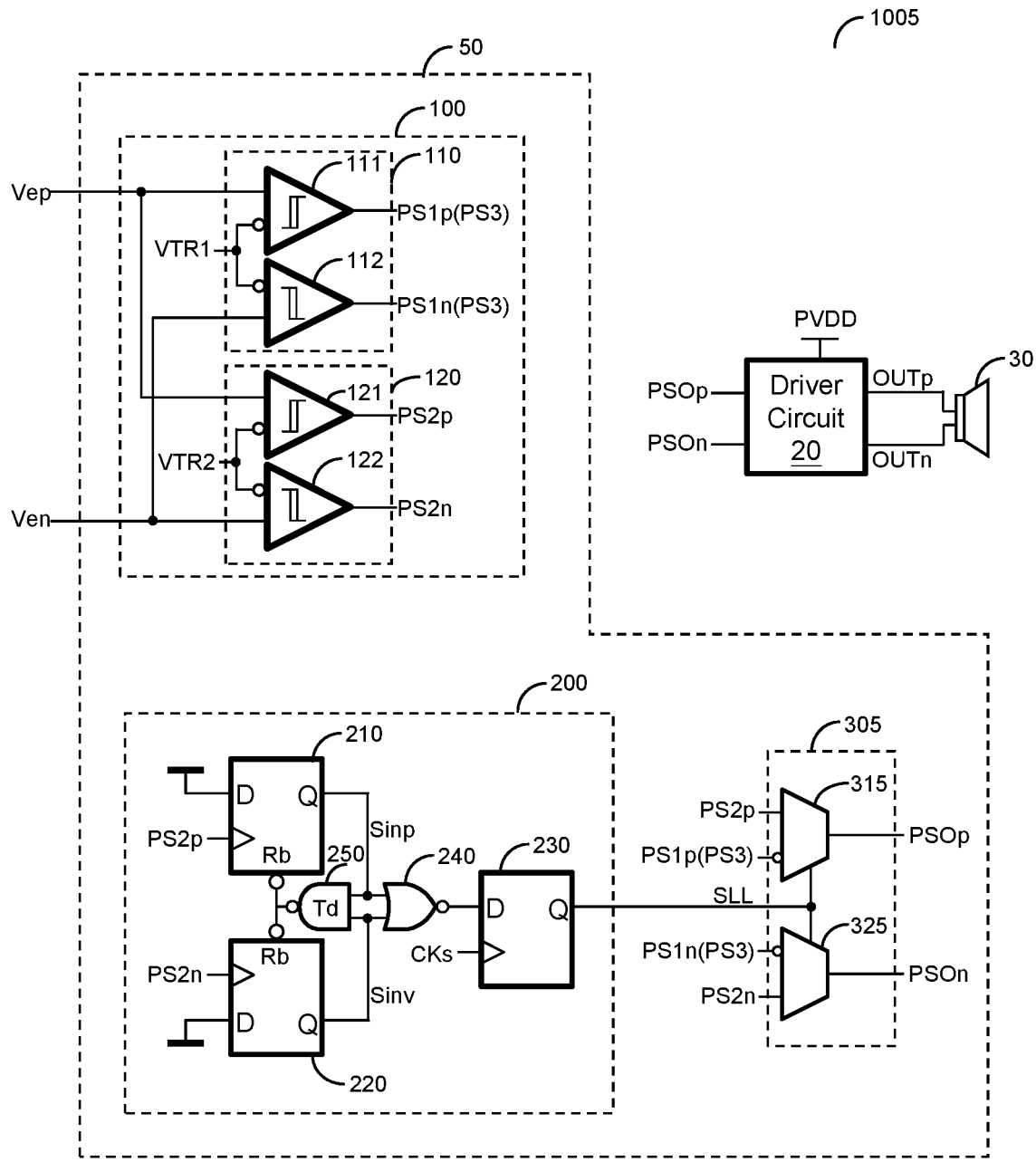
FIG. 5 shows a schematic circuit diagram of a BD type pulse width modulation (PWM) circuit for use in a class D amplifier according to an embodiment of the present invention.

Please refer to FIG. 4 in conjugation with FIG. 5. FIG. 4 illustrates a signal waveform diagram depicting the operation of a class D amplifier according to an embodiment of the present invention. FIG. 5 shows a schematic circuit diagram of a BD type pulse width modulation (PWM) circuit for use in a class D amplifier according to an embodiment of the present invention.

As shown in FIG. 4 and FIG. 5, the BD PWM circuit 50 is for use in a class D amplifier 1005. The BD PWM circuit 50 is configured to operably convert a pair of complementary input signals Vep and Ven to a pair of output PWM signals PSOp and PSOn. The pair of output PWM signals PSOp and PSOn are configured to operably control a driver circuit 20 to drive two ends of a load 30 (e.g., a speaker) in a pulse width modulation fashion. The BD PWM circuit 50 comprises: a duty ratio adjustment circuit 100, a load detection circuit 200 and an output selection circuit 305.

The duty ratio adjustment circuit 100 is configured to operably generate intermediate PWM signals, wherein each intermediate PWM signal includes: a basic PWM signal PS1, an offset PWM signal PS2 and a heavy load PWM signal PS3. Each intermediate PWM signal includes a corresponding in-phase sub-signal, a corresponding reversed-phase sub-signal, a corresponding differential mode signal and a corresponding common mode signal. The differential mode signal is a difference between the in-phase sub-signal and the reversed-phase sub-signal, whereas, the common mode signal is an average of the in-phase sub-signal and the reversed-phase sub-signal.

As shown in FIG. 5, in one embodiment, the duty ratio adjustment circuit 100 includes: a basic comparison circuit 110 and an offset comparison circuit 120.

The basic comparison circuit 110 is configured to operably modulate a basic modulation signal VTR1 according to the pair of input signals Vep and Ven, to generate the basic PWM signal PS1. As shown in FIG. 4, the common mode level Vcm1 (which is a voltage level) of the pair of input signals Vep and Ven is the same as the common mode level Vcm1 of basic modulation signal VTR1. The offset comparison circuit 120 is configured to operably modulate an offset modulation signal VTR2 according to the pair of input signals Vep and Ven, to generate the offset PWM signal PS2. There is a non-zero offset Vos between the offset modulation signal VTR2 and the basic modulation signal VTR1. That is, the non-zero offset Vos also exists between the common mode level Vcm2 of the offset modulation signal VTR2 and the common mode level Vcm1 of the pair of input signals Vep and Ven. In the embodiment shown in FIG. 4, the offset Vos is greater than zero; that is, the level of the offset modulation signal VTR2 is higher than the level of the basic modulation signal VTR1. However, that the offset Vos is greater than zero in the above-mentioned preferred embodiment is only an illustrative example, but not for limiting the broadest scope of the present invention. In other embodiments, it is also practicable and within the scope of the present invention that the offset Vos can be smaller than zero. In one embodiment, an absolute value of the offset Vos is smaller than ½ of a peak-to-peak value Vp-p of the basic modulation signal VTR1.

The load detection circuit 200 is configured to periodically determine, according to an operation period Ts of a clock signal CKs, whether the in-phase sub-signal PS2$p$ and the reversed-phase sub-signal PS2$n$ corresponding to the offset PWM signal PS2 both have a pulse within a previous operation period Ts, so as to enable a light load signal SLL accordingly, wherein the enablement of the light load signal SLL is indicative of a case where the levels of the pair of input signals Vep and Ven are lower than the light load threshold. In one embodiment, the level of the offset Vos is correlated with the light load threshold. To be more specific, as shown in FIG. 4, the in-phase sub-signal PS2$p$ and the reversed-phase sub-signal PS2$n$ corresponding to the offset PWM signal PS2 both have a pulse within operation periods T3-T5 (i.e., previous operation period), so the light load signal SLL will be enabled within operation periods T4-T6 (i.e., present operation period).

Note that "the levels of the pair of input signals Vep and Ven are lower than the light load threshold" means that the absolute values of AC levels of the pair of input signals Vep and Ven are lower than the light load threshold. Besides, it is noteworthy that, the term "light load" can refer to a situation where the input signal has a relatively lower level or refers to a situation where the input signal or the output signal has a relatively lower power.

The output selection circuit 305 is configured to operably select the offset PWM signal PS2 as the pair of output PWM signals PSOp and PSOn in a case when the light load signal SLL is enabled (i.e., in light load condition), and the output selection circuit 305 is configured to operably select the heavy load PWM signal PS3 as the pair of output PWM signals PSOp and PSOn in a case when the light load signal SLL is disabled (i.e., in heavy load condition), so that a root-mean-square power of the output PWM signal PSO is smaller than a root-mean-square power of the basic PWM signal PS1 in a case when the levels of the pair of input signals Vep and Ven are lower than the light load threshold. The heavy load PWM signal PS3 is correlated with the basic PWM signal PS1 and can be implemented in many ways, which will be described in detail below.

Please still refer to FIG. 4 and FIG. 5. In one embodiment, the heavy load PWM signal PS3 corresponds to (or is) the basic PWM signal PS1. When the light load signal SLL is disabled (i.e., in heavy load condition, which indicates that the levels of the pair of input signals Vep and Ven are higher than the light load threshold), the output selection circuit 305 is configured to operably select the basic PWM signal PS1 as the output PWM signal PSO (i.e., PSOp and PSOn).

More specifically, in this embodiment, the output selection circuit 305 includes a multiplexer 315 and a multiplexer 325, which are configured to operably select the basic PWM signal PS1 as the output PWM signal PSO in heavy load condition and is configured to operably select the offset PWM signal PS2 as the output PWM signal PSO in light load condition.

Please still refer to FIG. 5. The basic comparison circuit 110 includes a first comparator 111 and a second comparator 112. The first comparator 111 is configured to operably compare the in-phase input signal Vep with the basic modulation signal VTR1, so as to generate the in-phase sub-signal PS1$p$ of the basic PWM signal PS1. The second comparator 112 is configured to operably compare the reversed-phase input signal Ven with the basic modulation signal VTR1, so as to generate the reversed-phase sub-signal PS1$n$ of the basic PWM signal PS1.

The offset comparison circuit 120 includes a third comparator 121 and a fourth comparator 122. The third comparator 121 is configured to operably compare the in-phase input signal Vep with the offset modulation signal VTR2, so as to generate the in-phase sub-signal PS2$p$ of the offset PWM signal PS2. The fourth comparator 122 is configured to operably compare the reversed-phase input signal Ven with the offset modulation signal VTR2, so as to generate the reversed-phase sub-signal PS2$n$ of the offset PWM signal PS2. It is worthwhile noting that, in the above-mentioned embodiment, the input signals (i.e., Vep and Ven) are compared with the reversed-phase signal of the basic modulation signal VTR1 or the reversed-phase signal of the offset modulation signal VTR2.

The load detection circuit 200 includes: a first status circuit (for example but not limited to a first flip-flop) 210, a second flip-flop 220 and a third flip-flop 230. The first flip-flop 210 is configured to operably trigger an in-phase pulse indication signal Sinp according to a pulse of the in-phase sub-signal PS2$p$ of the offset PWM signal PS2. The second flip-flop 220 is configured to operably trigger a reversed-phase pulse indication signal Sinv according to a pulse of the reversed-phase sub-signal PS2$n$ of the offset PWM signal PS2. The third flip-flop 230 is configured to operably determine whether the in-phase pulse indication signal Sinp and the reversed-phase pulse indication signal Sinv are both enabled according to a clock signal CKs cycling by the operation period Ts, so as to trigger and enable the light load signal SLL accordingly, to thereby indicate whether the levels of the pair of input signals Vep and yen are lower than the light load threshold.

It is worthwhile noting that, in the above-mentioned embodiment, both of the basic modulation signal VTR1 and the offset modulation signal VTR2 are triangular waves. However, it should be understood that the basic modulation signal VTR1 and the offset modulation signal VTR2 being implemented as triangular waves in the above-mentioned preferred embodiment is only an illustrative example, but not for limiting the broadest scope of the present invention. In other embodiments, it is also practicable and within the scope of the present invention that the basic modulation signal VTR1 and/or the offset modulation signal VTR2 can be implemented as for example a sawtooth wave. Besides, as shown in FIG. 4, the triangular wave (or the sawtooth wave) has a period which is synchronous with the operation period Ts.

Figure 6:
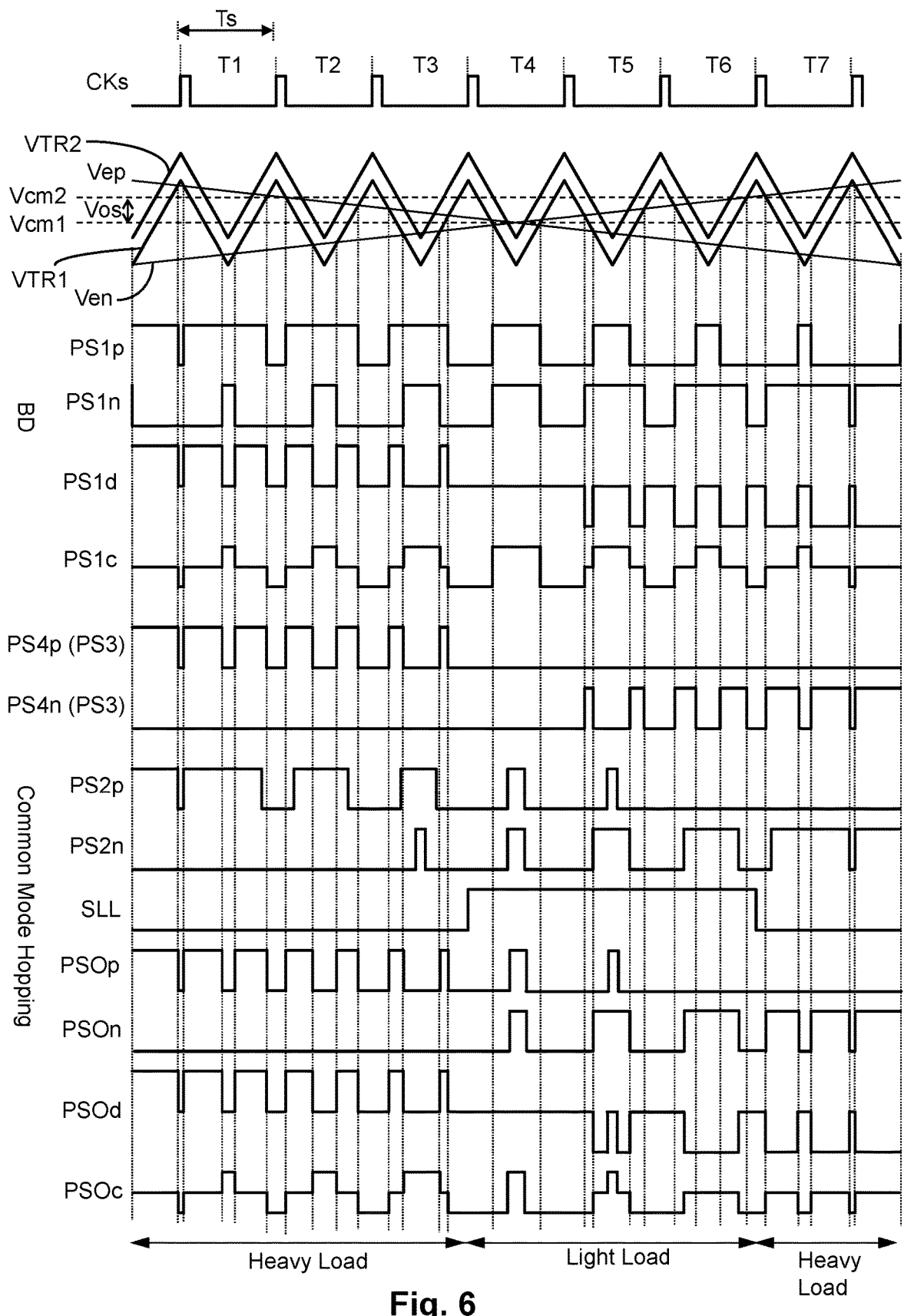
FIG. 6 illustrates a signal waveform diagram depicting the operation of a class D amplifier according to another embodiment of the present invention.
Figure 7:
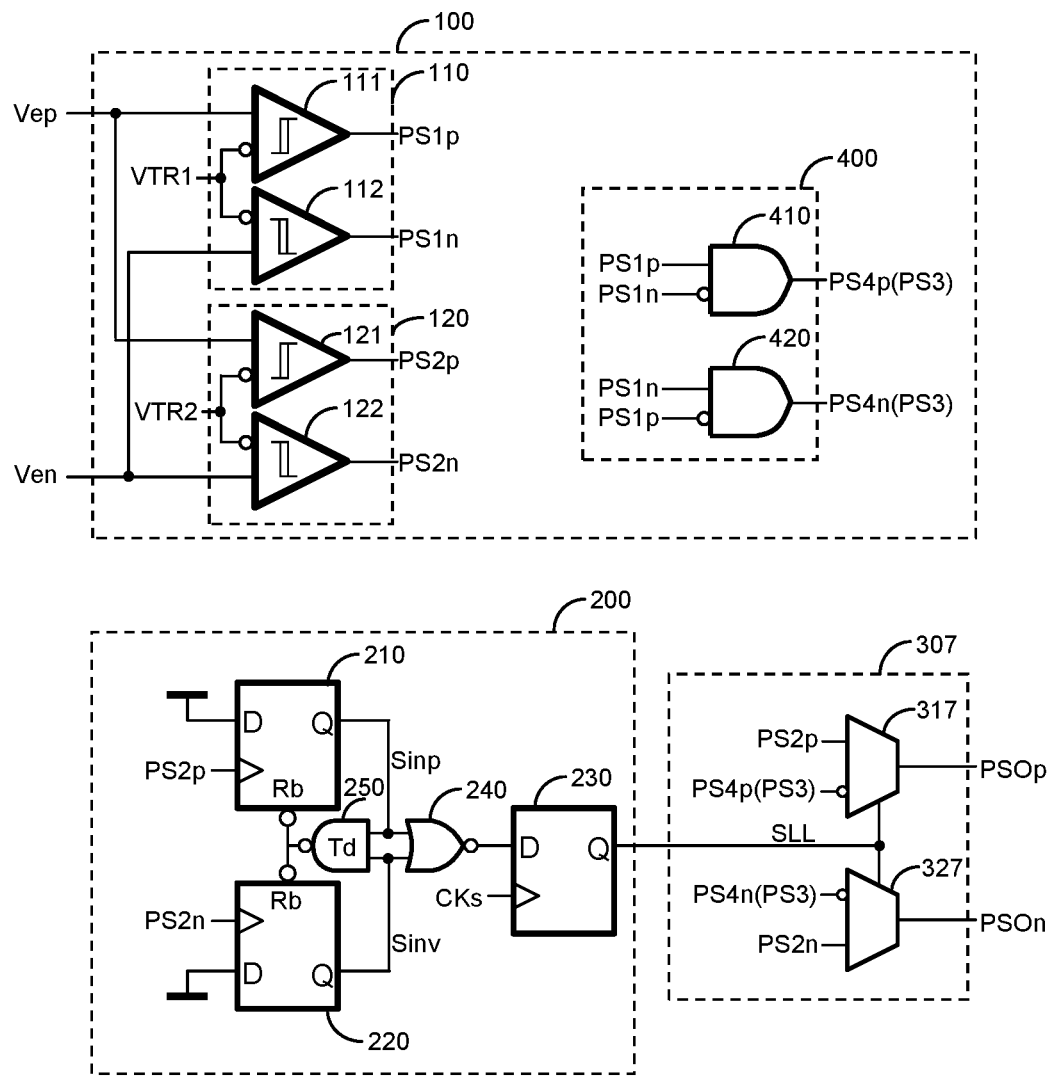
FIG. 7 shows a schematic circuit diagram of a BD type pulse width modulation (PWM) circuit for use in a class D amplifier according to another embodiment of the present invention.

Please refer to FIG. 6 in conjugation with FIG. 7. FIG. 6 illustrates a signal waveform diagram depicting the operation of a class D amplifier according to another embodiment of the present invention. FIG. 7 shows a schematic circuit diagram of a BD type pulse width modulation (PWM) circuit (i.e., BD PWM circuit 70) for use in a class D amplifier according to another embodiment of the present invention.

In this embodiment, the plural intermediate PWM signals further include a one-side PWM signal PS4. The duty ratio adjustment circuit 100 further includes: a one-side selection circuit 400. The one-side selection circuit 400 is configured to operably generate the in-phase sub-signal PS4$p$ corresponding to the one-side PWM signal PS4 according to a positive value of the differential mode signal PS1$d$ corresponding to the basic PWM signal PS1, and to operably generate the reversed-phase sub-signal PS4$n$ corresponding to the one-side PWM signal PS4 according to a negative value (an absolute value of the negative value in this embodiment) of the differential mode signal PS1$d$ corresponding to the basic PWM signal PS1.

As shown in FIG. 6 and FIG. 7, in this embodiment, the heavy load PWM signal PS3 corresponds to (or is) the one-side PWM signal PS4 (i.e., PS4$p$ and PS4$n$). When the light load signal SLL is disabled (i.e., in heavy load condition, which indicates that the levels of the pair of input signals Vep and Ven are higher than the light load threshold), the output selection circuit 305 is configured to operably select the one-side PWM signal PS4 (i.e., PS4$p$ and PS4$n$) as the output PWM signal PSO (i.e., PSOp and PSOn).

More specifically, in this embodiment, the output selection circuit 307 includes a multiplexer 317 and a multiplexer 327, which are configured to operably select a one-side PWM signal PS4 as the output PWM signal PSO in heavy load condition and is configured to operably select an offset PWM signal PS2 as the output PWM signal PSO in light load condition.

In one embodiment, the one-side selection circuit 400 includes: a first AND gate 410 and a second AND gate 420. The first AND gate 410 is configured to operably execute an AND logic operation on a reversed-phase signal of the reversed-phase sub-signal PS1$n$ of the basic PWM signal PS1 and the in-phase sub-signal PS1$p$ of the basic PWM signal PS1, so as to generate the in-phase sub-signal PS4$p$ of the one-side PWM signal PS4. The second AND gate 420 is configured to operably execute an AND logic operation on a reversed-phase signal of the in-phase sub-signal PS1$p$ of the basic PWM signal PS1 and the reversed-phase sub-signal PS1n of the basic PWM signal PS1, so as to generate the reversed-phase sub-signal PS4n of the one-side PWM signal PS4.

Figure 8:
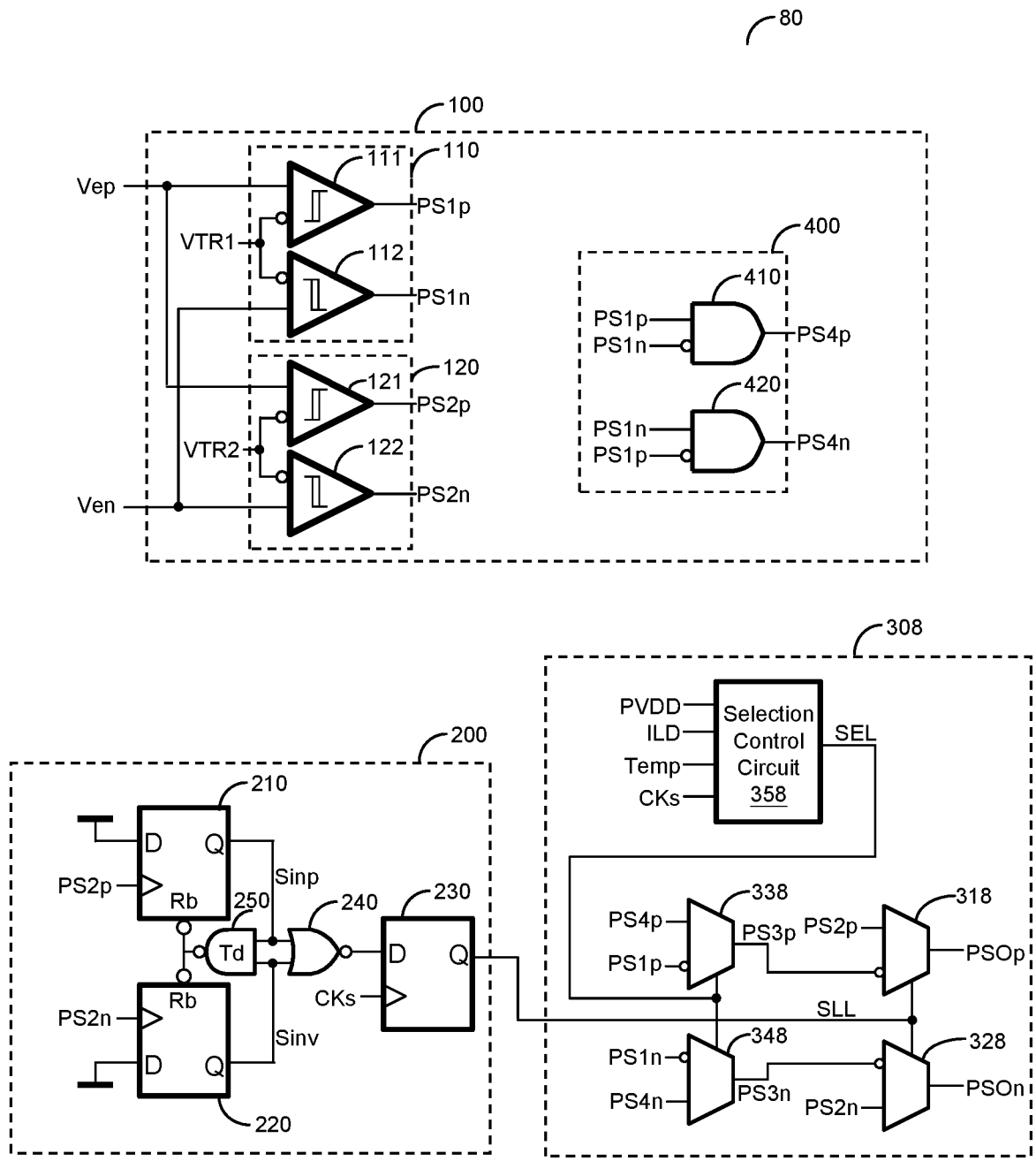
FIG. 8 shows a schematic circuit diagram of a BD type pulse width modulation (PWM) circuit for use in a class D amplifier according to yet another embodiment of the present invention.

Please refer to FIG. 4 in conjugation with FIG. 6 and FIG. 8. FIG. 8 shows a schematic circuit diagram of a BD type pulse width modulation (PWM) circuit for use in a class D amplifier according to yet another embodiment of the present invention. The BD PWM circuit 80 is similar to the above-mentioned BD PWM circuit 50 and the above-mentioned BD PWM circuit 70, but is different in that: an output selection circuit 308 of the BD PWM circuit 80 can select the one-side PWM signal PS4 or the basic PWM signal PS1 as the heavy load PWM signal PS3 according to a selection signal SEL. To be more specific, the output selection circuit 308 includes multiplexers 318, 328, 338 and 348. The multiplexers 318 and 328 are configured to operably select the heavy load PWM signal PS3 or the offset PWM signal PS2 as the output PWM signal PSO according to a light load signal SLL. The multiplexers 338 and 348 are configured to operably select the one-side PWM signal PS4 or the basic PWM signal PS1 as the heavy load PWM signal PS3 according to the selection signal SEL.

In one embodiment, the output selection circuit 308 of the BD PWM circuit 80 further includes a selection control circuit 358. The selection control circuit 358 is configured to operably determine the selection signal SEL according to the power supply PVDD of the driver stage circuit 20, a level (ILD) of a power or a current of the load 30, a temperature Temp related to the class D amplifier or an operation frequency Fs (e.g., through receiving the clock signal CKs). The operation frequency Fs can be represented as following equation: Fs=1/Ts.

As shown by the above, the BD PWM circuit (e.g., BD PWM circuits 50, 60 and 70) of the present invention can adaptively hop according to the levels of the input signals, so as to switch or select the modulated PWM signals (e.g., heavy load PWM signal PS3 or offset PWM signal PS2) which are modulated by the modulation signals (e.g., basic modulation signal VTR1 or offset modulation signal VTR2) which have different common mode voltages. As a result, in a case of light load, the present invention can ensure the duty ratio of the common mode signal PSOc of the output PWM signal PSO to be away from 50%. Consequently, the present invention can effectively reduce the ripple current and the idle current, and can ensure a lower distortion of the output signal.

Besides, as shown in FIG. 4 and FIG. 6, the present invention can maintain the average voltage and the switching frequency of the differential mode signal PSOd of the output PWM signal PSO to be unchanged.

In the aforementioned embodiments, when (as the embodiments shown in FIG. 4 and FIG. 6) the offset is greater than zero, because the common mode voltage is offset so that it hops by a fast response time, it is ensured that the duty ratio of the common mode signal PSOc can be lower than 50% in light load condition. On the other hand, in other embodiments, when the offset is smaller than zero, by hopping the common mode voltage according to the above-mentioned mechanism, it is ensured that the duty ratio of the common mode signal PSOc can be higher than 50% in light load condition. In light load condition, regardless whether the duty ratio of the common mode signal PSOc is higher than or lower than 50%, as long as the duty ratio of the common mode signal PSOc is away from 50%, the ripple current and idle current can be reduced.

Besides, according to the present invention, the number of an the offset PWM signal is not limited. In other embodiments, plural offset PWM signals can be provided, to further reduce distortion.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A BD type pulse width modulation (PWM) circuit for use in a class D amplifier, which is configured to operably convert a pair of complementary input signals to a pair of output PWM signals; the BD PWM circuit comprising:

a duty ratio adjustment circuit, which is configured to operably generate a plurality of intermediate PWM signals, wherein the plurality of intermediate PWM signals include: a basic PWM signal, an offset PWM signal and a heavy load PWM signal, wherein each intermediate PWM signal correspondingly has an in-phase sub-signal, a reversed-phase sub-signal and a differential mode signal, wherein the differential mode signal is a difference between the in-phase sub-signal and the reversed-phase sub-signal, wherein the duty ratio adjustment circuit includes:

a basic comparison circuit, which is configured to operably modulate a basic modulation signal according to the pair of input signals, to generate the basic PWM signal, wherein a common mode level of the pair of input signals is the same as a common mode level of basic modulation signal; and an offset comparison circuit, which is configured to operably modulate an offset modulation signal according to the pair of input signals, to generate the offset PWM signal, wherein the offset modulation signal and the basic modulation signal have a non-zero offset in between;

a load detection circuit, which is configured to operably determine whether levels of the pair of input signals are lower than a light load threshold according to the offset PWM signal, wherein when the levels of the pair of input signals are lower than the light load threshold, a light load signal is enabled; and an output selection circuit, which is configured to operably select the offset PWM signal as the pair of output PWM signals in a case when the levels of the pair of input signals are lower than the light load threshold and select the heavy load PWM signal as the pair of output PWM signals in a case when the levels of the pair of input signals are not lower than the light load threshold, so that a root-mean-square power of the pair of output PWM signals is smaller than a root-mean-square power of the basic PWM signal;

wherein the heavy load PWM signal is correlated with the basic PWM signal.

2. The BD PWM circuit of claim 1, wherein the load detection circuit is configured to periodically determine, according to an operation period, whether the in-phase sub-signal and the reversed-phase sub-signal corresponding to the offset PWM signal both have a pulse within a previous operation period, so as to enable the light load signal accordingly, wherein the enablement of the light load signal is indicative of a case where the levels of the pair of input signals are lower than the light load threshold.

3. The BD PWM circuit of claim 1, wherein:
the heavy load PWM signal corresponds to or is the basic PWM signal; or
the plurality of intermediate PWM signals further includes a one-side PWM signal, and the heavy load PWM signal corresponds to or is the one-side PWM signal;
wherein the duty ratio adjustment circuit further includes:
a one-side selection circuit, which is configured to operably generate the in-phase sub-signal corresponding to the one-side PWM signal according to a positive value of the differential mode signal corresponding to the basic PWM signal, and to operably generate the reversed-phase sub-signal corresponding to the one-side PWM signal according to a negative value of the differential mode signal corresponding to the basic PWM signal.

4. The BD PWM circuit of claim 3, wherein the heavy load PWM signal is the one-side PWM signal or the basic PWM signal.

5. The BD PWM circuit of claim 4, wherein the pair of output PWM signals are configured to operably control a driver stage circuit, so as to drive two ends of a load in a pulse width modulation fashion, wherein the heavy load PWM signal is determined to be the one-side PWM signal or the basic PWM signal according to a power supply of the driver stage circuit, a level of the load, a temperature related to the class D amplifier, or an operation frequency, wherein the operation frequency corresponds to the operation period.

6. The BD PWM circuit of claim 1, wherein a level of the offset is correlated with the light load threshold.

7. The BD PWM circuit of claim 1, wherein each of the basic modulation signal and the offset modulation signal is configured as a triangular wave or a sawtooth wave, and wherein the basic modulation signal and the offset modulation signal are both synchronous with the operation period.

8. The BD PWM circuit of claim 7, wherein an absolute value of a level of the offset is smaller than ½ of a peak-to-peak value of the basic modulation signal.

9. The BD PWM circuit of claim 1, wherein:
the basic comparison circuit includes:
a first comparator, which is configured to operably compare an in-phase input signal of the pair of input signals with the basic modulation signal, so as to generate the in-phase sub-signal of the basic PWM signal; and a second comparator, which is configured to operably compare a reversed-phase input signal of the pair of input signals with the basic modulation signal, so as to generate the reversed-phase sub-signal of the basic PWM signal; and the offset comparison circuit includes:
a third comparator, which is configured to operably compare the in-phase input signal of the pair of input signals with the offset modulation signal, so as to generate the in-phase sub-signal of the offset PWM signal; and
a fourth comparator, which is configured to operably compare the reversed-phase input signal of the pair of input signals with the offset modulation signal, so as to generate the reversed-phase sub-signal of the offset PWM signal.

10. The BD PWM circuit of claim 2, wherein the load detection circuit includes:
a first status circuit, which is configured to operably trigger an in-phase pulse indication signal according to the in-phase sub-signal of the offset PWM signal;
a second status circuit, which is configured to operably trigger a reversed-phase pulse indication signal according to the reversed-phase sub-signal of the offset PWM signal; and
a third status circuit, which is configured to operably determine whether the in-phase pulse indication signal and the reversed-phase pulse indication signal are both enabled according to a clock signal cycling by the operation period, so as to trigger and enable the light load signal, thereby indicating that the levels of the pair of input signals are lower than the light load threshold.

11. The BD PWM circuit of claim 3, wherein the one-side selection circuit includes:
a first logic gate, which is configured to operably execute an AND logic operation on a reversed-phase signal of the reversed-phase sub-signal of the basic PWM signal and the in-phase sub-signal of the basic PWM signal, so as to generate the in-phase sub-signal of the one-side PWM signal; and
a second logic gate, which is configured to operably execute an AND logic operation on a reversed-phase signal of the in-phase sub-signal of the basic PWM signal and the reversed-phase sub-signal of the basic PWM signal, so as to generate the reversed-phase sub-signal of the one-side PWM signal.

12. A BD type pulse width modulation (PWM) method for use in a class D amplifier, which is configured to operably convert a pair of complementary input signals to a pair of output PWM signals; the BD PWM method comprising:
step S1: generating a plurality of intermediate PWM signals, wherein the plurality of intermediate PWM signals includes: a basic PWM signal, an offset PWM signal and a heavy load PWM signal, wherein each intermediate PWM signal correspondingly has an in-phase sub-signal, a reversed-phase sub-signal and a differential mode signal, wherein the differential mode signal is a difference between the in-phase sub-signal and the reversed-phase sub-signal, wherein the step for generating the plurality of intermediate PWM signals includes:
step S11: modulating a basic modulation signal according to the pair of input signals, to generate the basic PWM signal, wherein a common mode level of the pair of input signals is the same as a common mode level of basic modulation signal; and step S12: modulating an offset modulation signal according to the pair of input signals, to generate the offset PWM signal, wherein the offset modulation signal and the basic modulation signal have a non-zero offset in between;

step S2: determining whether levels of the pair of input signals are lower than a light load threshold according to the offset PWM signal; and step S3: selecting the offset PWM signal as the pair of output PWM signals in a case when the levels of the pair of input signals are lower than the light load threshold and selecting the heavy load PWM signal as the pair of output PWM signals in a case when the levels of the pair of input signals are not lower than the light load threshold, so that a root-mean-square power of the pair of output PWM signals is smaller than a root-mean-square power of the basic PWM signal;

wherein the heavy load PWM signal is correlated with the basic PWM signal.

13. The BD PWM method of claim 12, wherein the step for determining whether levels of the pair of input signals are lower than the light load threshold according to the offset PWM signal includes:

periodically determining, according to an operation period, whether the in-phase sub-signal and the reversed-phase sub-signal corresponding to the offset PWM signal both have a pulse within a previous operation period, so as to determine whether levels of the pair of input signals are lower than the light load threshold.

14. The BD PWM method of claim 12, wherein:

the heavy load PWM signal corresponds to or is the basic PWM signal; or the plurality of intermediate PWM signals further includes a one-side PWM signal, and the heavy load PWM signal corresponds to or is the one-side PWM signal;

wherein the step for generating the plurality of intermediate PWM signals further includes:

generating the in-phase sub-signal corresponding to the one-side PWM signal according to a positive value of the differential mode signal corresponding to the basic PWM signal, and generating the reversed-phase sub-signal corresponding to the one-side PWM signal according to a negative value of the differential mode signal corresponding to the basic PWM signal.

15. The BD PWM method of claim 14, wherein the heavy load PWM signal is the one-side PWM signal or the basic PWM signal.

16. The BD PWM method of claim 15, wherein the pair of output PWM signals are configured to operably control a driver stage circuit, so as to drive two ends of a load in a pulse width modulation fashion, wherein the heavy load PWM signal is determined to be the one-side PWM signal or the basic PWM signal according to a power supply of the driver stage circuit, a level of the load, a temperature related to the class D amplifier, or an operation frequency, wherein the operation frequency corresponds to the operation period.

17. The BD PWM method of claim 12, wherein a level of the offset is correlated with the light load threshold.

18. The BD PWM method of claim 12, wherein each of the basic modulation signal and the offset modulation signal is configured as a triangular wave or a sawtooth wave, and wherein the basic modulation signal and the offset modulation signal are both synchronous with the operation period.

19. The BD PWM method of claim 18, wherein an absolute value of a level of the offset is smaller than ½ of a peak-to-peak value of the basic modulation signal.

20. The BD PWM method of claim 12, wherein:

the step for generating the basic PWM signal includes:

comparing an in-phase input signal of the pair of input signals with the basic modulation signal, so as to generate the in-phase sub-signal of the basic PWM signal; and comparing a reversed-phase input signal of the pair of input signals with the basic modulation signal, so as to generate the reversed-phase sub-signal of the basic PWM signal; and the step for generating the offset PWM signal includes:

comparing the in-phase input signal of the pair of input signals with the offset modulation signal, so as to generate the in-phase sub-signal of the offset PWM signal; and comparing the reversed-phase input signal of the pair of input signals with the offset modulation signal, so as to generate the reversed-phase sub-signal of the offset PWM signal.

* * * * *